United States Patent
Taniyama et al.

(10) Patent No.: US 10,734,602 B2
(45) Date of Patent: Aug. 4, 2020

(54) DISPLAY DEVICE

(71) Applicant: Sharp Kabushiki Kaisha, Sakai, Osaka (JP)

(72) Inventors: Hiroki Taniyama, Sakai (JP); Tohru Okabe, Sakai (JP); Ryosuke Gunji, Sakai (JP); Shinsuke Saida, Sakai (JP); Akira Inoue, Sakai (JP); Yoshihiro Nakada, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/467,159

(22) PCT Filed: Jun. 16, 2017

(86) PCT No.: PCT/JP2017/022402
§ 371 (c)(1),
(2) Date: Jun. 6, 2019

(87) PCT Pub. No.: WO2018/229991
PCT Pub. Date: Dec. 20, 2018

(65) Prior Publication Data
US 2019/0319214 A1 Oct. 17, 2019

(51) Int. Cl.
*H01L 51/52* (2006.01)
*H01L 27/32* (2006.01)

(52) U.S. Cl.
CPC ...... *H01L 51/5246* (2013.01); *H01L 27/3258* (2013.01); *H01L 51/5253* (2013.01)

(58) Field of Classification Search
CPC ............ H01L 27/3258; H01L 51/5246; H01L 51/5253

USPC .......................................................... 257/40
See application file for complete search history.

(56) References Cited

U.S. PATENT DOCUMENTS

| 2015/0091030 A1 | 4/2015 | Lee et al. | |
| 2015/0243711 A1* | 8/2015 | Hong | H01L 27/323 257/40 |
| 2015/0380685 A1* | 12/2015 | Lee | H01L 51/5243 257/40 |

(Continued)

FOREIGN PATENT DOCUMENTS

| JP | 2003-323974 A | 11/2003 |
| JP | 2014-225380 A | 12/2014 |
| JP | 2017-147165 A | 8/2017 |

OTHER PUBLICATIONS

Official Communication issued in International Patent Application No. PCT/JP2017/022402, dated Sep. 19, 2017.

*Primary Examiner* — Dzung Tran
(74) *Attorney, Agent, or Firm* — Keating & Bennett, LLP

(57) ABSTRACT

A first damming wall and a second damming wall are provided in a frame region. The first damming wall surrounds a display region formed from a first organic material and overlaps with a circumferential end part of an organic layer. The second damming wall includes a top part formed from a second organic material in the periphery of the first damming wall, and overlaps with an edge of the circumferential end part of the organic layer. The second damming wall includes a bottom part located closer to a base substrate, the bottom part being formed from a material constituting parts of switching elements.

17 Claims, 9 Drawing Sheets

(56) References Cited

U.S. PATENT DOCUMENTS

| | | | |
|---|---|---|---|
| 2016/0045782 A1* | 2/2016 | Wong | A63B 23/0211 |
| | | | 482/132 |
| 2016/0204373 A1 | 7/2016 | Park | |
| 2016/0260936 A1* | 9/2016 | Okamoto | H01L 51/56 |
| 2017/0033312 A1 | 2/2017 | Kim et al. | |
| 2017/0110532 A1 | 4/2017 | Kim et al. | |
| 2017/0244063 A1* | 8/2017 | Furuie | H05K 999/99 |

* cited by examiner

DISPLAY DEVICE

TECHNICAL FIELD

The disclosure relates to a display device and a method of manufacturing the same.

BACKGROUND ART

In recent years, organic EL display devices, which use organic electroluminescence (EL) elements and are of the self-luminous type, have attracted attention as display devices that can replace liquid crystal display devices. For organic EL display devices, a seal structure has been proposed to inhibit the degradation of the organic EL elements due to the penetration of, for example, moisture and oxygen. The seal structure includes a sealing film covering the organic EL elements, and the sealing film includes a stack of an inorganic layer and an organic layer.

For example, as a material that can be applied to the organic layer of the sealing film, PTL 1 discloses an organic EL display element sealing agent which can be easily applied using an ink-jet method, and which has excellent curing properties as well as excellent transparency and excellent barrier properties in the cured product.

CITATION LIST

Patent Literature

PTL 1: JP 2014-225380 A

SUMMARY

Technical Problem

However, the film formation properties of an organic layer formed using an ink-jet method are easily affected by the state of the surface on which the film is formed, and it is difficult to form the circumferential end parts (edges) of the organic layer with precision. Such being the case, it is necessary to form the organic layer slightly oversized to completely cover the inorganic layer in the layer below the organic layer, which makes it difficult to narrow the frame of the organic EL display device.

Having been conceived in light of the foregoing points, an object of the disclosure is to precisely form circumferential end parts of an organic layer constituting a sealing film and achieve a narrower frame.

Solution to Problem

To achieve the above-described above, a display device according to the disclosure includes: a base substrate; a plurality of switching elements provided on the base substrate; a flattening film, provided on the plurality of switching elements, that flattens a surface shape formed by the plurality of switching elements; a light emitting element provided on the flattening film, the light emitting element including a partition; and a sealing film provided covering the light emitting element, the sealing film including a first inorganic layer, an organic layer, and a second inorganic layer layered in that order, wherein a display region in which an image is displayed, and a frame region located in the periphery of the display region, are defined in the display device; a first damming wall and a second damming wall are provided in the frame region, the first damming wall being formed from a first organic material, surrounding the display region, and overlapping with a circumferential end part of the organic layer, the second damming wall being formed in the periphery of the first damming wall from a second organic material, the second damming wall including a top part and overlapping with an edge of the circumferential end part of the organic layer; and the second damming wall includes a bottom part located closer to the base substrate, the bottom part being formed from a material constituting a part of the switching elements.

Advantageous Effects of Disclosure

According to the disclosure, the first damming wall and the second damming wall are provided in the frame region, and the second damming wall includes the bottom part, which is formed from the material constituting a part of the switching elements. Accordingly, the circumferential end parts of the organic layer constituting the sealing film can be formed with precision, and the narrowing of the frame can be achieved.

DESCRIPTION OF EMBODIMENTS

Embodiments of the disclosure will be described in detail below with reference to the drawings. The disclosure is not limited to the embodiments described below.

First Embodiment

Figure 1:
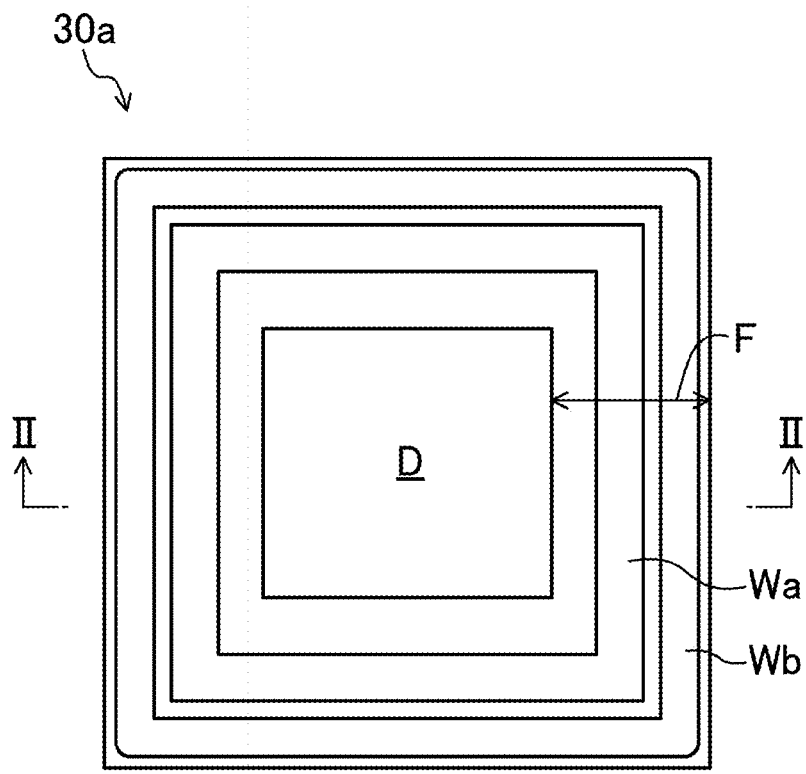
FIG. 1 is a plan view of an organic EL display device according to a first embodiment of the disclosure, schematically illustrating the configuration of the device.
Figure 2:
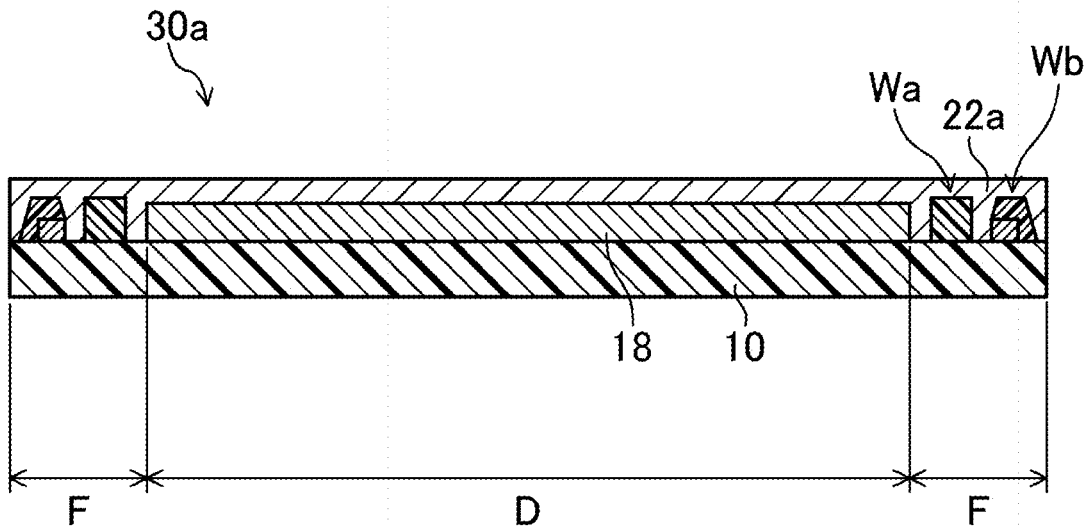
FIG. 2 is a cross-sectional view of the organic EL display device taken along line II-II in FIG. 1, schematically illustrating the configuration of the device.
Figure 3:
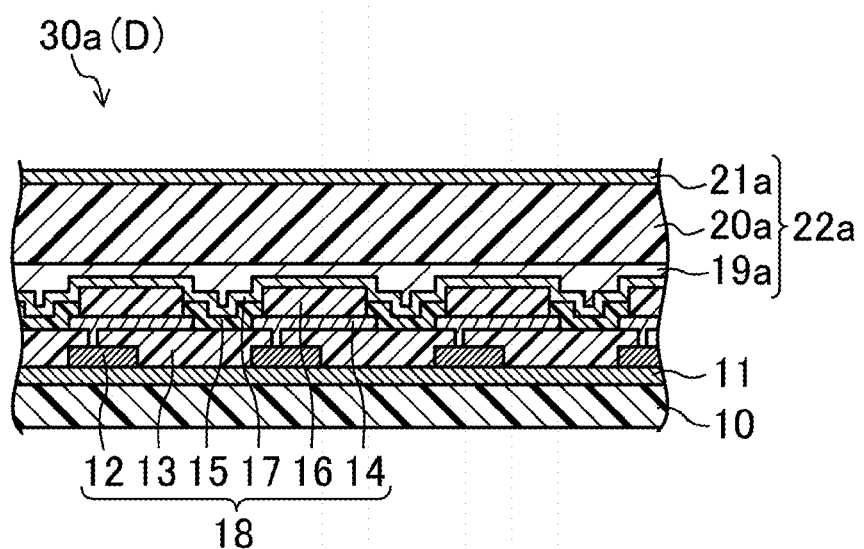
FIG. 3 is a cross-sectional view illustrating, in detail, the configuration of a display region of the organic EL display device according to the first embodiment of the disclosure.
Figure 4:
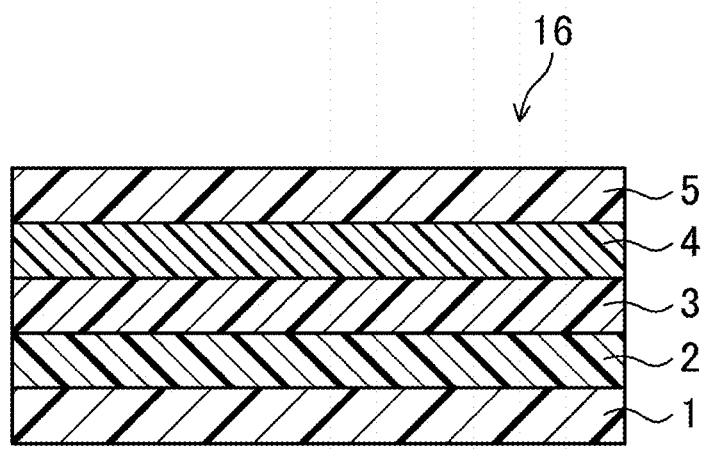
FIG. 4 is a cross-sectional view of an organic EL layer included in the organic EL display device according to the first embodiment of the disclosure.
Figure 5:
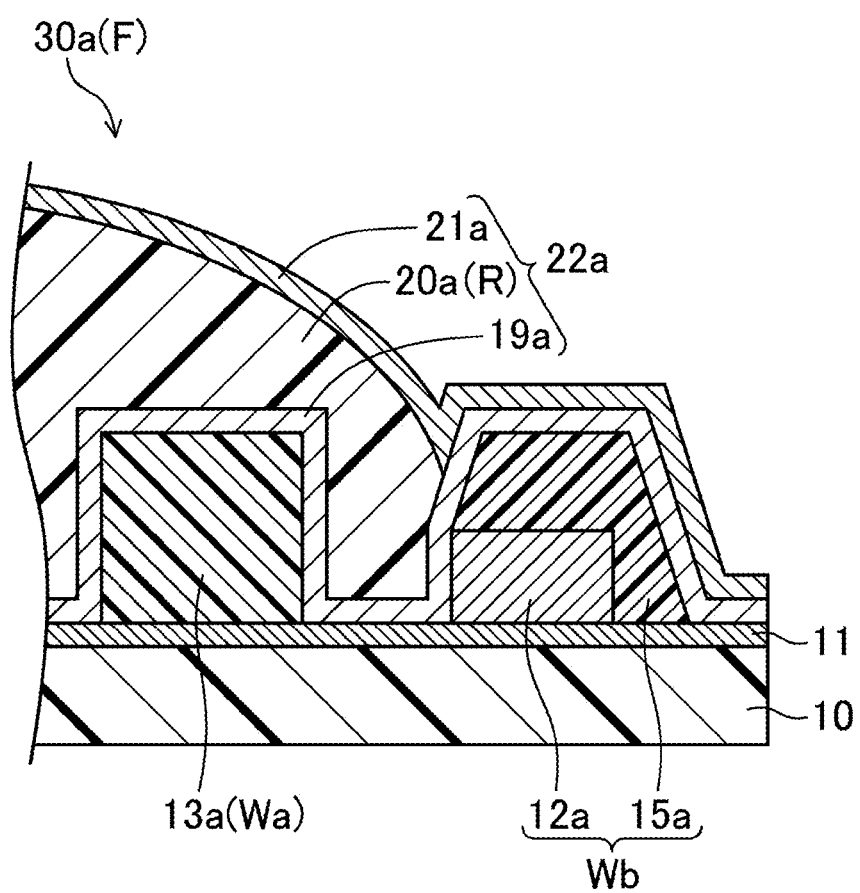
FIG. 5 is a cross-sectional view illustrating, in detail, the configuration of a frame region of the organic EL display device according to the first embodiment of the disclosure.
Figure 6:
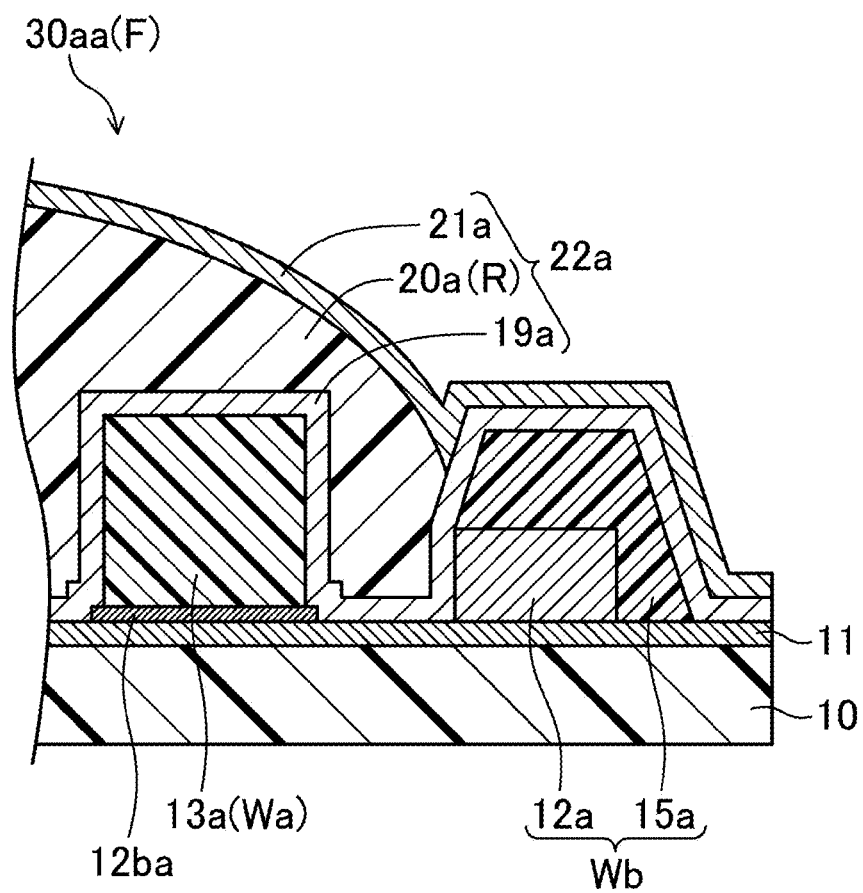
FIG. 6 is a cross-sectional view illustrating, in detail, the configuration of a frame region in a first variation on the organic EL display device according to the first embodiment of the disclosure.
Figure 7:
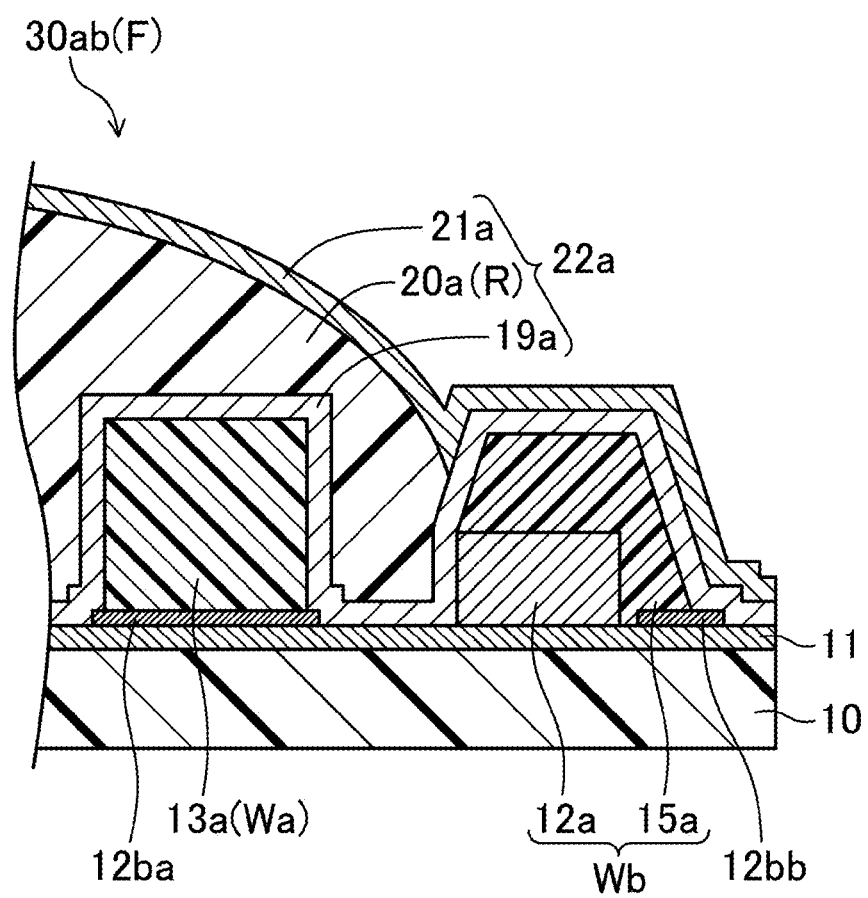
FIG. 7 is a cross-sectional view illustrating, in detail, the configuration of a frame region in a second variation on the organic EL display device according to the first embodiment of the disclosure.

FIGS. 1 to 7 illustrate the first embodiment of an organic EL display device according to the disclosure. Here, FIG. 1 is a plan view of an organic EL display device 30a according to the present embodiment, schematically illustrating the configuration of the device. FIG. 2 is a cross-sectional view of the organic EL display device 30a taken along line II-II in FIG. 1, schematically illustrating the configuration of the device. FIG. 3 is a cross-sectional view illustrating, in detail, the configuration of a display region D in the organic EL display device 30a. FIG. 4 is a cross-sectional view of an organic EL layer 16 included in the organic EL display device 30a. FIG. 5 is a cross-sectional view illustrating, in detail, a frame region F of the organic EL display device 30a. FIGS. 6 and 7 are cross-sectional views illustrating, in detail, the configuration of the frame region F in organic EL display devices 30aa and 30ab, which are first and second variations on the organic EL display device 30a.

As illustrated in FIGS. 1 to 3, the organic EL display device 30a includes a base substrate 10, an organic EL element 18, a first damming wall Wa and a second damming wall Wb, and a sealing film 22a. The organic EL element 18 is provided upon the base substrate 10 with a base coating film 11 interposed therebetween, and the sealing film 22a is provided covering the organic EL element 18, the first damming wall Wa, and the second damming wall Wb. Here, in the organic EL display device 30a, a display region D in which images are displayed is defined as a rectangular shape as illustrated in FIG. 1, and in the display region D, a plurality of pixels are arranged in a matrix. Each of the pixels includes a subpixel for displaying a red tone, a subpixel for displaying a green tone, and a subpixel for displaying a blue tone, for example. These subpixels are disposed adjacent to one another. As illustrated in FIGS. 1 and 2, in the organic EL display device 30a, the frame-shaped frame region F is defined in the periphery of the display region D. The first damming wall Wa and the second damming wall Wb are provided in the frame region F.

The base substrate 10 is a plastic substrate formed from a polyimide resin, for example, a glass substrate, or the like, and is flexible.

The base coating film 11 is an inorganic insulating film such as a silicon oxide film or a silicon nitride film, for example.

As illustrated in FIG. 2, the organic EL element 18 is provided in the display region D. As illustrated in FIG. 3, the organic EL element 18 includes a plurality of TFTs 12, a flattening film 13, a plurality of first electrodes 14, a partition 15, a plurality of organic EL layers 16, and a second electrode 17, provided in that order on the base coat layer 11.

The TFT 12 is a switching element provided for each of the subpixels in the display region D. The TFTs 12 each include, for example, a gate electrode, a gate insulator film, a semiconductor layer, and source and drain electrodes. The gate electrode is disposed over the base coating film 11. The gate insulator film is disposed to cover the gate electrode. The semiconductor layer is disposed over the gate insulator film and overlapping the gate electrode. The source and drain electrodes are disposed over the semiconductor layer and face each other. In the present embodiment, the bottom-gate type is described as an example of the TFT 12, but the TFT 12 may be of the top-gate type.

As illustrated in FIG. 3, the flattening film 13 is disposed to cover the TFTs 12 except for a portion of each of the drain electrodes, and is provided so as to flatten the surface shape formed by the TFTs 12. Here, the flattening film 13 is composed of a colorless transparent organic resin material (a first organic material) such as an acrylic resin, for example. Note that the flattening film 13 is formed so that the end faces thereof are substantially vertical, by setting the temperature at which the organic resin material is baked to a high temperature (approximately 250° C.).

As illustrated in FIG. 3, the plurality of first electrodes 14 are provided in a matrix over the flattening film 13, corresponding to the plurality of subpixels, and serve as a plurality of pixel electrodes. Here, as illustrated in FIG. 3, the first electrodes 14 are connected to the respective drain electrodes of the TFTs 12 via respective contact holes formed in the flattening film 13. The first electrode 14 functions to inject holes into the organic EL layer 16. It is more preferable that the first electrodes 14 include a material having a large work function to improve the efficiency of hole injection into the organic EL layer 16. Examples of materials that may be included in the first electrode 14 include metal materials, such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). Further examples of materials that may be included in the first electrode 14 include alloys, the examples of which include magnesium (Mg)-copper (Cu), magnesium (Mg)-silver (Ag), sodium (Na)-potassium (K), astatine (At)-astatine oxide ($AtO_2$), lithium (Li)-aluminum (Al), lithium (Li)-calcium (Ca)-aluminum (Al), and lithium fluoride (LiF)-calcium (Ca)-aluminum (Al). Further examples of materials that may be included in the first electrode 14 include electrically conductive oxides, the examples of which include tin oxide (SnO), zinc oxide (ZnO), indium tin oxide (ITO), and indium zinc oxide (IZO). The first electrode 14 may include a stack of two or more layers of any of the above-mentioned materials. Examples of materials having a large work function include indium tin oxide (ITO) and indium zinc oxide (IZO).

As illustrated in FIG. 3, the partition 15 is disposed in a lattice pattern so as to cover the peripheral portions of each of the first electrodes 14. Examples of materials that may constitute the partition 15 include inorganic insulating materials such as silicon oxide ($SiO_2$), silicon nitride ($SiN_x$ (x is a positive number)) such as trisilicon tetranitride ($Si_3N_4$) and silicon oxynitride (SiNO), or organic resin materials such as polyimide resins, acrylic resins, polysiloxane resins, and novolak resins (a second organic material).

As illustrated in FIG. 3, the plurality of organic EL layers 16 are arranged in a matrix on the respective first electrodes 14, and correspond to the respective subpixels. Here, as illustrated in FIG. 4, the organic EL layers 16 each include a hole injection layer 1, a hole transport layer 2, a light-emitting layer 3, an electron transport layer 4, and an electron injection layer 5, which are arranged in that order over the first electrode 14.

The hole injection layer 1 is also referred to as an anode buffer layer, and functions to reduce the energy level difference between the first electrode 14 and the organic EL layer 16 so as to improve the efficiency of hole injection into the organic EL layer 16 from the first electrode 14. Examples of materials that may constitute the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The hole transport layer 2 functions to improve the efficiency of hole transport from the first electrode 14 to the organic EL layer 16. Examples of materials that may constitute the hole transport layer 2 include porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

The light-emitting layer 3 is a region where, when a voltage is applied via the first electrode 14 and the second electrode 17, holes and electrons are injected from the first electrode 14 and the second electrode 17, respectively, and the holes and the electrons recombine. Here, the light-emitting layer 3 is formed from a material having a high light emitting efficiency. Examples of materials that may constitute the light-emitting layer 3 include metal oxinoid compounds (8-hydroxyquinoline metal complexes), naphthalene derivatives, anthracene derivatives, diphenyl ethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, and polysilane.

The electron transport layer 4 functions to facilitate the efficient migration of the electrons to the light-emitting layer 3. Examples of materials that may constitute the electron transport layer 4 include organic compounds, the examples of which include oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, and metal oxinoid compounds.

The electron injection layer 5 functions to reduce the energy level difference between the second electrode 17 and the organic EL layer 16, to improve the efficiency of electron injection into the organic EL layer 16 from the second electrode 17. Because of this function, the driving voltage for the organic EL element 18 can be reduced. The electron injection layer 5 is also referred to as a cathode buffer layer. Examples of materials that may constitute the electron injection layer 5 include inorganic alkaline compounds, such as lithium fluoride (LiF), magnesium fluoride ($MgF_2$), calcium fluoride ($CaF_2$), strontium fluoride ($SrF_2$), and barium fluoride ($BaF_2$); aluminum oxide ($Al_2O_3$); and strontium oxide (SrO).

As illustrated in FIG. 3, the second electrode 17 is provided so as to cover the organic EL layers 16 and the partitions 15, and is provided in common for the plurality of subpixels. The second electrode 17 functions to inject electrons into the organic EL layer 16. It is more preferable that the second electrode 17 includes a material having a small work function to improve the efficiency of electron injection into the organic EL layer 16. Examples of materials that may constitute the second electrode 17 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). Further examples of materials that may be included in the second electrode 17 include alloys, the examples of which include magnesium (Mg)-copper (Cu), magnesium (Mg)-silver (Ag), sodium (Na)-potassium (K), astatine (At)-astatine oxide ($AtO_2$), lithium (Li)-aluminum (Al), lithium (Li)-calcium (Ca)-aluminum (Al), and lithium fluoride (LiF)-calcium (Ca)-aluminum (Al). Further examples of materials that may be included in the second electrode 17 include electrically conductive oxides, the examples of which include tin oxide (SnO), zinc oxide (ZnO), indium tin oxide (ITO), and indium zinc oxide (IZO). The second electrode 17 may include a stack of two or more layers of any of the above-mentioned materials. Examples of materials having a small work function include magnesium (Mg), lithium (Li), lithium fluoride (LiF), magnesium (Mg)-copper (Cu), magnesium (Mg)-silver (Ag), sodium (Na)-potassium (K), lithium (Li)-aluminum (Al), lithium (Li)-calcium (Ca)-aluminum (Al), and lithium fluoride (LiF)-calcium (Ca)-aluminum (Al).

As illustrated in FIG. 1, the first damming wall Wa is provided so as to surround the display region D. Furthermore, as illustrated in FIG. 5, the first damming wall Wa is in contact with a circumferential end part R of an organic layer 20a (described later) of the sealing film 22a, with a first inorganic layer 19a (described later) of the sealing film 22a located between the first damming wall Wa and the organic layer 20a. The first damming wall Wa overlaps with the circumferential end part R of the organic layer 20a. The present and following embodiments describe the first damming wall Wa, the second damming wall Wb, and a third damming wall Wc, which are formed in frame shapes, as examples. However, the first damming wall Wa, the second damming wall Wb, and the third damming wall Wc may be formed intermittently along the periphery of the display region D, for example. Here, as illustrated in FIG. 5, the first damming wall Wa is composed of a flattening layer 13a formed from the same material and in the same layer as the flattening film 13. Note that a first metal layer 12ba may be provided between the base substrate 10 (the base coating film 11 provided thereon) and the first damming wall Wa, as illustrated in FIG. 6. Here, the first metal layer 12ba is formed from the same material and in the same layer as capacitance lines, the gate electrodes of the TFTs 12, and the like, for example. As illustrated in FIG. 6, the first metal layer 12ba is provided so that the perimeter edge surfaces thereof are located further outward than the perimeter edge surfaces of the flattening layer 13a, so as to protrude from the first damming wall Wa (the flattening layer 13a). Accordingly, the inorganic insulating film that will serve as the first inorganic layer 19a can be formed on the surface of the substrate where the flattening layer 13a is formed in a protruding manner, with the formation of gaps in that the inorganic insulating film being suppressed.

As illustrated in FIG. 1, the second damming wall Wb is provided so as to surround the first damming wall Wa. Furthermore, as illustrated in FIG. 5, the second damming wall Wb is in contact with the circumferential end part R of the organic layer 20a, with the first inorganic layer 19a located between the first damming wall Wa and the organic layer 20a. The first damming wall Wa overlaps with the edges of the circumferential end part R of the organic layer 20a. Here, as illustrated in FIG. 5, the second damming wall Wb includes a bottom part 12a and a top part 15a. The bottom part 12a is formed from the same material and in the same layer as the source electrodes of the TFTs 12. The top part 15a is provided on the bottom part 12a and is formed from the same material and in the same layer as the partitions 15. Note that the angle formed between the surface of the base substrate 10 and the side surface of the top part 15a is greater than or equal to 70 degrees, for example. Although the present embodiment describes an example in which the bottom part 12a is formed from the same material and in the same layer as the source electrodes of the TFTs 12, if top-gate type TFTs are used, for example, the bottom part 12a may be formed from the same material and in the same layer as the gate electrodes. Additionally, a second metal layer 12bb may be provided between the base substrate 10 (the base coating film 11 provided thereon) and the top part 15a of the second damming wall Wb, as illustrated in FIG. 7. Here, the second metal layer 12bb is formed from the same material and in the same layer as capacitance lines, the gate electrodes of the TFTs 12, and the like, for example. As illustrated in FIG. 7, the second metal layer 12bb is provided so that the perimeter edge surface on the outer side thereof is located further outward than the corresponding perimeter edge surface of the top part 15a, so as to protrude from the top part 15a. Accordingly, the inorganic insulating film that will serve as the first inorganic layer 19a can be formed on the surface of the substrate where the top part 15a is formed in a protruding manner, with the formation of gaps in that inorganic insulating film being suppressed.

As illustrated in FIGS. 3 and 5, the sealing film 22a includes the first inorganic layer 19a, the organic layer 20a, and a second inorganic layer 21a. The first inorganic layer 19a is provided so as to cover the organic EL element 18. The organic layer 20a is provided on the first inorganic layer 19a. The second inorganic layer 21a is provided so as to cover the organic layer 20a.

The first inorganic layer 19a and the second inorganic layer 21a are composed of an inorganic insulating film such as a silicon nitride film, a silicon oxide film, a silicon oxynitride film, or the like, for example. Preferably, the second inorganic layer 21a is composed of a silicon nitride film, which has high barrier properties, for example.

The organic layer 20a is composed of an organic resin material such as an acrylate, polyurea, parylene, polyimide, polyamide, or the like, for example.

The organic EL display device 30a configured as described above is flexible. In each of the subpixels, the light-emitting layer 3 of the organic EL layer 16 is caused, via the TFT 12, to emit light as appropriate so as to display images.

A method of manufacturing the organic EL display device 30a according to the present embodiment will be described next. Note that the method of manufacturing the organic EL display device 30a according to the present embodiment includes forming an organic EL element and forming a sealing film.

Forming Organic EL Element

Using a known method, the base coating film 11, the organic EL element 18 (the TFTs 12, the flattening film 13, the first electrodes 14, the partitions 15, the organic EL layers 16 (the hole injection layer 1, the hole transport layer 2, the light-emitting layer 3, the electron transport layer 4, and the electron injection layer 5), the second electrode 17), the first damming wall Wa, and the second damming wall Wb are formed on the surface of the base substrate 10, which is made from a polyimide resin, for example.

Forming Sealing Film

First, the first inorganic layer 19a is formed by depositing an inorganic insulating film, such as a silicon nitride film, through plasma CVD (Chemical Vapor Deposition) at a thickness of approximately several tens of nm to several μm, so as to cover the organic EL element 18 formed through the above-described forming of the organic EL element.

Next, the organic layer 20a is formed by using an ink-jet method to eject an organic resin material such as an acrylate, at a thickness of approximately several μm to several tens of μm, onto the entire surface of the substrate on which the first inorganic layer 19a has been formed.

Furthermore, the second inorganic layer 21a is formed by depositing an inorganic insulating film, such as a silicon nitride film, through plasma CVD at a thickness of approximately several tens of nm to several μm, onto the substrate on which the organic layer 20a has been formed. As a result, the sealing film 22a composed of the first inorganic layer 19a, the organic layer 20a, and the second inorganic layer 21a is formed.

The organic EL display device 30a of the present embodiment can be manufactured in this manner.

The organic EL display device 30a of the present embodiment described above can achieve the following effects (1) to (3).

(1) The second damming wall Wb that overlaps with the edges of the circumferential end part R of the organic layer 20a in the sealing film 22a includes the bottom part 12a and the top part 15a. The bottom part 12a is formed from the material that constitutes the source electrodes of the TFTs 12. The top part 15a is formed from the material that constitutes the partitions 15. Here, in the second damming wall Wb, the end faces of the top part 15a, which is formed at the same time as the partitions 15, are formed in an inclined manner so that the lower ends thereof broaden. However, the end faces of the bottom part 12a, which is formed at the same time as the source electrodes of the TFTs 12, are formed so as to be substantially vertical. As such, the damming effect of the second damming wall Wb can be increased. Accordingly, on the substrate on which the first damming wall Wa and the second damming wall Wb are formed, a situation where the organic resin material, which is ejected using an ink-jet method to serve as the organic layer 20a, spreads out to the periphery can be suppressed. This makes it possible to form the circumferential end parts of the organic layer 20a in the sealing film 22a with precision. As a result, a gap between the first damming wall Wa and the second damming wall Wb, i.e., the width of the frame region F, can be designed to be narrow. The circumferential end parts of the organic layer 20a, which partially constitutes the sealing film 22a, can therefore be formed with precision, and a narrower frame can be realized.

(2) The second inorganic layer 21a is provided so as to cover the organic layer 20a, and thus the sealing performance of the sealing film 22a can be improved when the second inorganic layer 21a is composed of a silicon nitride film, which has high barrier properties.

Second Embodiment

Figure 8:
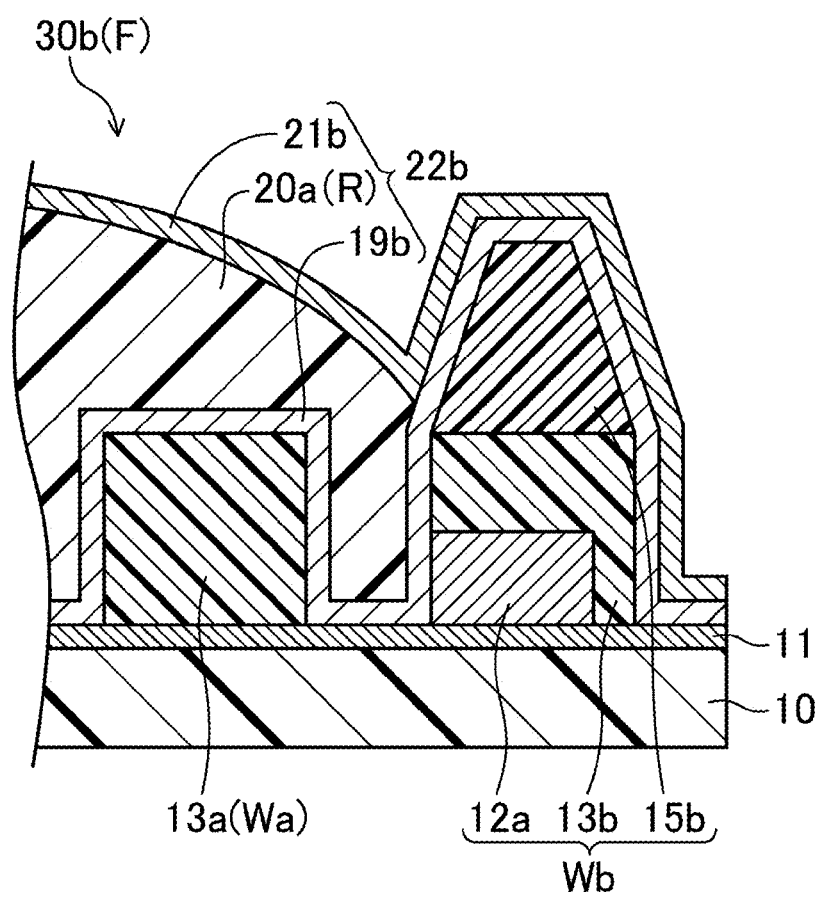
FIG. 8 is a cross-sectional view illustrating, in detail, the configuration of a frame region of an organic EL display device according to a second embodiment of the disclosure.

FIG. 8 illustrates the second embodiment of an organic EL display device according to the disclosure. Here, FIG. 8 is a cross-sectional view illustrating, in detail, the configuration of the frame region F in an organic EL display device 30b according to the present embodiment. In the following embodiments, parts identical to those in FIGS. 1 to 7 are designated by the same reference characters, and detailed descriptions thereof will be omitted.

The first embodiment describes the organic EL display device 30a, in which the second damming wall Wb includes the bottom part 12a and the top part 15a, as an example. However, the present embodiment will describe the organic EL display device 30b, in which the second damming wall Wb includes the bottom part 12a, a middle part 13b, and a top part 15b, as an example.

As illustrated in FIG. 8, the organic EL display device 30b includes the base substrate 10, the organic EL element 18 (see FIG. 2 and the like), the first damming wall Wa and the second damming wall Wb, and a sealing film 22b. The organic EL element 18 is provided upon the base substrate 10 with the base coating film 11 interposed therebetween, and the sealing film 22b is provided covering the organic EL element 18, the first damming wall Wa, and the second damming wall Wb. Like the organic EL display device 30a of the above-described the first embodiment, in the organic EL display device 30b, the frame-shaped frame region F is defined in the periphery of the rectangular display region D in which images are displayed. The first damming wall Wa and the second damming wall Wb are provided in the frame region F.

As illustrated in FIG. 8, the first damming wall Wa is in contact with the circumferential end part R of the organic layer 20a of the sealing film 22b, with a first inorganic layer 19b (described later) of the sealing film 22b located between the first damming wall Wa and the organic layer 20a. The first damming wall Wa overlaps with the circumferential end part R of the organic layer 20a.

As illustrated in FIG. 8, the second damming wall Wb is in contact with the circumferential end part R of the organic layer 20a of the sealing film 22b, with the first inorganic layer 19b of the sealing film 22b located between the second damming wall Wb and the organic layer 20a. The second damming wall Wb overlaps with the edge of the circumferential end part R of the organic layer 20a. Here, as illustrated in FIG. 8, the second damming wall Wb includes the bottom part 12a, the middle part 13b, and the top part 15b. The bottom part 12a is formed from the same material and in the same layer as the source electrodes of the TFTs 12. The middle part 13b is provided on the bottom part 12a and is formed from the same material and in the same layer as the flattening film 13. The top part 15b is provided on the middle part 13b and is formed from the same material and in the same layer as the partitions 15.

As illustrated in FIG. 8, the sealing film 22b includes the first inorganic layer 19b, the organic layer 20a, and a second inorganic layer 21b. The first inorganic layer 19b is provided so as to cover the organic EL element 18. The organic layer 20a is provided on the first inorganic layer 19b. The second inorganic layer 21b is provided so as to cover the organic layer 20a.

The first inorganic layer 19b and the second inorganic layer 21b are composed of an inorganic insulating film such as a silicon nitride film, a silicon oxide film, a silicon oxynitride film, or the like, for example. Preferably, the second inorganic layer 21b is composed of a silicon nitride film, which has high barrier properties, for example.

The above-described organic EL display device 30b is flexible. In each of the subpixels, the light-emitting layer 3 of the organic EL layer 16 is caused, via the TFT 12, to emit light as appropriate so as to display images.

The organic EL display device 30b of the present embodiment can be manufactured by, for example, changing the shape of a pattern used when forming the flattening film 13 and the partitions 15 in the method of manufacturing the organic EL display device 30a described above in the first embodiment.

The organic EL display device 30b of the present embodiment described above can achieve the following effect (3), in addition to the above-described effects (1) and (2).

To describe (1) in more detail, the second damming wall Wb, which overlaps with the edges of the circumferential end part R of the organic layer 20a in the sealing film 22b, includes the bottom part 12a, the middle part 13b, and the top part 15b. The bottom part 12a is formed from the material constituting the source electrodes of the TFTs 12. The middle part 13b is formed from the same material and in the same layer as the flattening film 13. The top part 15b is formed from the material constituting the partitions 15. Here, in the second damming wall Wb, the end faces of the top part 15b, which is formed at the same time as the partitions 15, are formed in an inclined manner so that the lower ends thereof broaden. However, the end faces of the bottom part 12a, which is formed at the same time as the source electrodes of the TFTs 12, and the end faces of the middle part 13b, which is formed at the same time as the flattening film 13, are formed so as to be substantially vertical. As such, the damming effect of the second damming wall Wb can be increased. Accordingly, on the substrate on which the first damming wall Wa and the second damming wall Wb are formed, a situation where the organic resin material, which is ejected using an ink-jet method to serve as the organic layer 20a, spreads out to the periphery can be suppressed. This makes it possible to form the circumferential end parts of the organic layer 20a in the sealing film 22b with precision. As a result, a gap between the first damming wall Wa and the second damming wall Wb, i.e., the width of the frame region F, can be designed to be narrow. The circumferential end parts of the organic layer 20a, which partially constitutes the sealing film 22b, can therefore be formed with precision, and a narrower frame can be realized.

To describe (2) in more detail, the second inorganic layer 21b is provided so as to cover the organic layer 20a, and thus the sealing performance of the sealing film 22b can be improved when the second inorganic layer 21b is composed of a silicon nitride film, which has high barrier properties.

(3) The second damming wall Wb is formed so as to be higher than the second damming wall Wb of the above-described the first embodiment by an amount equivalent to the film thickness of the middle part 13b, and thus the damming effect of the second damming wall Wb can be increased even further.

Third Embodiment

Figure 9:
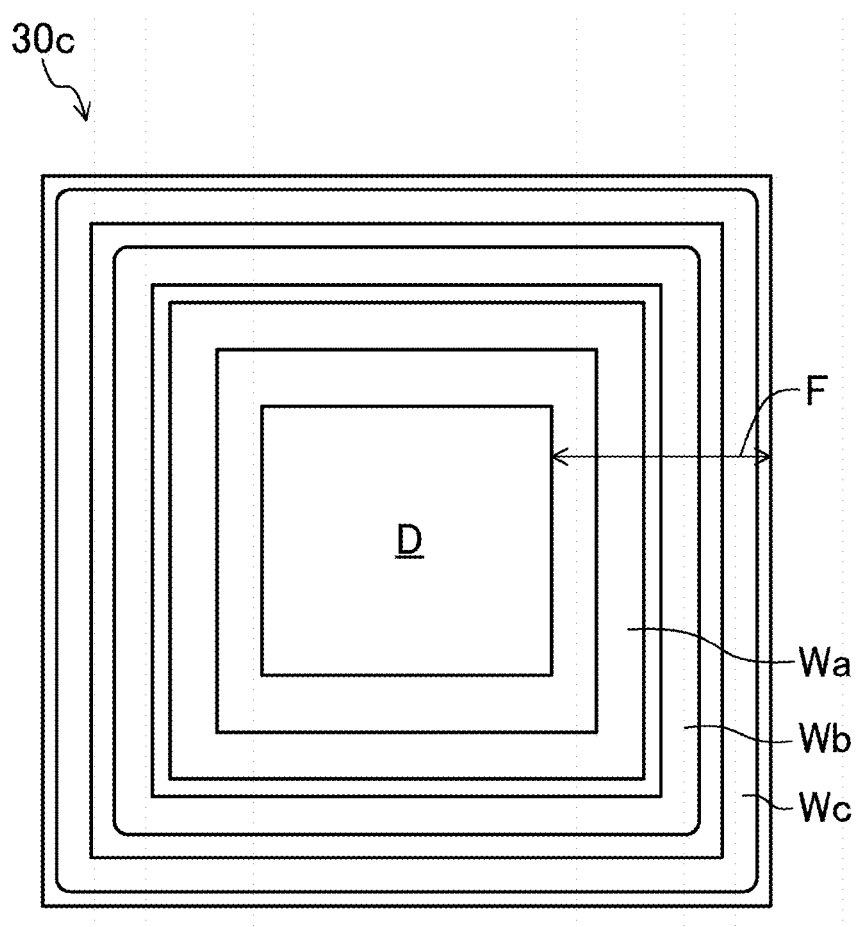
FIG. 9 is a plan view of an organic EL display device according to a third embodiment of the disclosure, schematically illustrating the configuration of the device.
Figure 10:
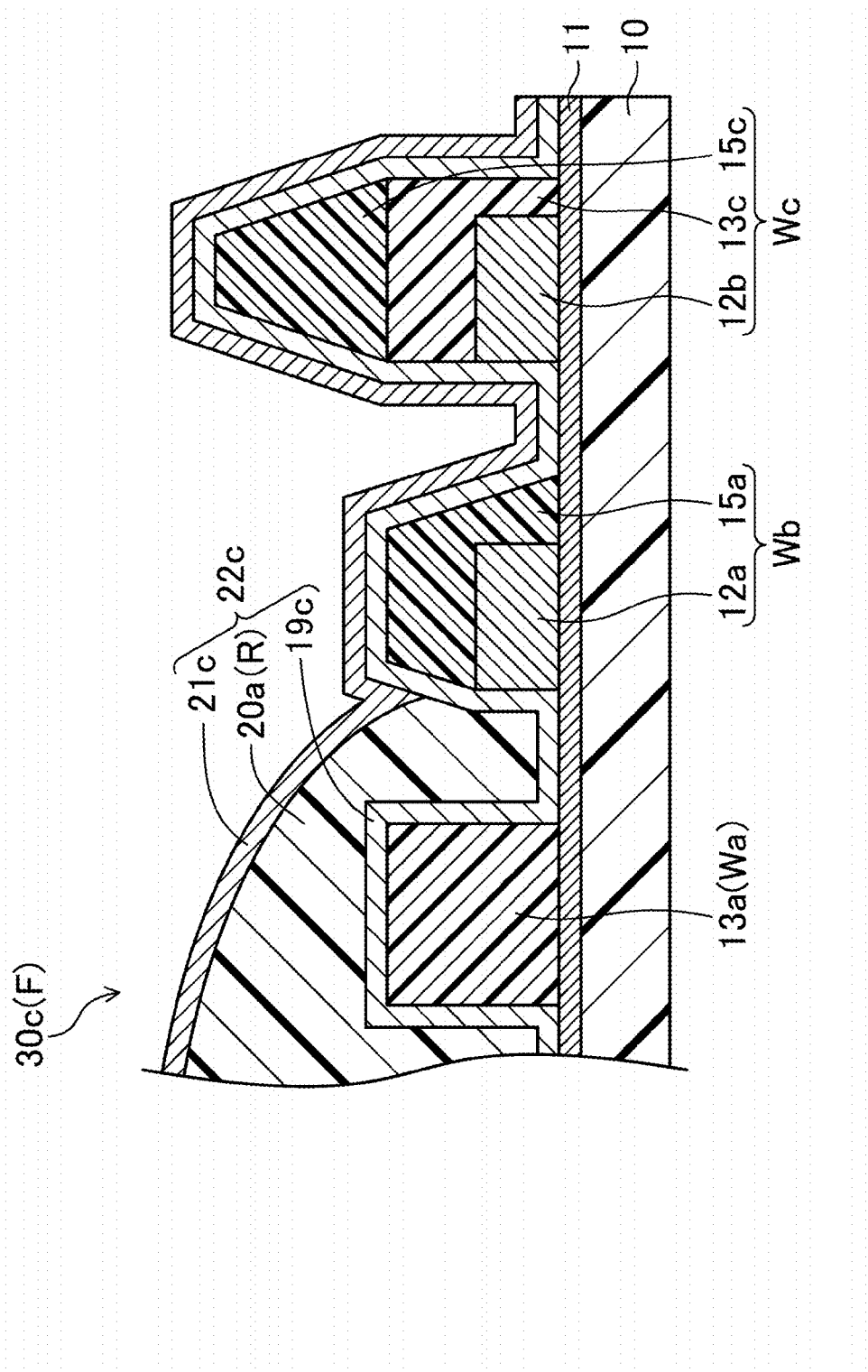
FIG. 10 is a cross-sectional view illustrating, in detail, the configuration of a frame region of the organic EL display device according to the third embodiment of the disclosure.

FIGS. 9 and 10 illustrate the third embodiment of an organic EL display device according to the disclosure. Here, FIG. 9 is a plan view of an organic EL display device 30c according to the present embodiment, schematically illustrating the configuration of the device. FIG. 10 is a cross-sectional view illustrating, in detail, the frame region F of the organic EL display device 30c.

The foregoing Embodiments 1 and 2 describe the organic EL display devices 30a and 30b, which include the first damming wall Wa and the second damming wall Wb, as examples. However, the present embodiment describes the organic EL display device 30c, which includes the first damming wall Wa, the second damming wall Wb, and the third damming wall Wc.

As illustrated in FIGS. 9 and 10, the organic EL display device 30c includes the base substrate 10, the organic EL element 18 (see FIG. 2 and the like), the first damming wall Wa, second damming wall Wb, and third damming wall Wc, and a sealing film 22c. The organic EL element 18 is provided upon the base substrate 10 with the base coating film 11 interposed therebetween, and the sealing film 22c is provided covering the organic EL element 18, the first damming wall Wa, and the second damming wall Wb. Like the organic EL display device 30*a* of the above-described the first embodiment, in the organic EL display device 30*c*, the frame-shaped frame region F is defined in the periphery of the rectangular display region D in which images are displayed. The first damming wall Wa, the second damming wall Wb, and the third damming wall Wc are provided in the frame region F.

As illustrated in FIG. 10, the first damming wall Wa is in contact with the circumferential end part R of the organic layer 20*a* of the sealing film 22*c*, with a first inorganic layer 19*c* (described later) of the sealing film 22*c* located between the first damming wall Wa and the organic layer 20*a*. The first damming wall Wa overlaps with the circumferential end part R of the organic layer 20*a*.

As illustrated in FIG. 10, the second damming wall Wb is in contact with the circumferential end part R of the organic layer 20*a* of the sealing film 22*c*, with the first inorganic layer 19*c* of the sealing film 22*c* located between the second damming wall Wb and the organic layer 20*a*. The second damming wall Wb overlaps with the edge of the circumferential end part R of the organic layer 20*a*. Here, as illustrated in FIG. 10, the second damming wall Wb includes the bottom part 12*a* and the top part 15*a*. The bottom part 12*a* is formed from the same material and in the same layer as the source electrodes of the TFTs 12. The top part 15*a* is provided on the bottom part 12*a* and is formed from the same material and in the same layer as the partitions 15.

As illustrated in FIG. 10, the third damming wall Wc is provided so as to surround the second damming wall Wb. Here, as illustrated in FIG. 10, the third damming wall Wc includes a bottom part 12*b*, a middle part 13*c*, and a top part 15*c*. The bottom part 12*b* is formed from the same material and in the same layer as the source electrodes of the TFTs 12. The middle part 13*c* is provided on the bottom part 12*b* and is formed from the same material and in the same layer as the flattening film 13. The top part 15*c* is provided on the middle part 13*c* and is formed from the same material and in the same layer as the partitions 15.

As illustrated in FIG. 10, the sealing film 22*c* includes the first inorganic layer 19*c*, the organic layer 20*a*, and a second inorganic layer 21*c*. The first inorganic layer 19*c* is provided so as to cover the organic EL element 18. The organic layer 20*a* is provided on the first inorganic layer 19*c*. The second inorganic layer 21*c* is provided so as to cover the organic layer 20*a*.

The first inorganic layer 19*c* and the second inorganic layer 21*c* are composed of an inorganic insulating film such as a silicon nitride film, a silicon oxide film, a silicon oxynitride film, or the like, for example. Preferably, the second inorganic layer 21*c* is composed of a silicon nitride film, which has high barrier properties, for example.

The above-described organic EL display device 30*c* is flexible. In each of the subpixels, the light-emitting layer 3 of the organic EL layer 16 is caused, via the TFT 12, to emit light as appropriate so as to display images.

The organic EL display device 30*c* of the present embodiment can be manufactured by, for example, changing the shape of a pattern used when forming the flattening film 13 and the partitions 15 in the method of manufacturing the organic EL display device 30*a* described above in the first embodiment.

The organic EL display device 30*c* of the present embodiment described above can achieve the following effect (4), in addition to the above-described effects (1) and (2).

To describe (1) in more detail, the second damming wall Wb that overlaps with the edges of the circumferential end part R of the organic layer 20*a* in the sealing film 22*c* includes the bottom part 12*a* and the top part 15*a*. The bottom part 12*a* is formed from the material that constitutes the source electrodes of the TFTs 12. The top part 15*a* is formed from the material that constitutes the partitions 15. Here, in the second damming wall Wb, the end faces of the top part 15*a*, which is formed at the same time as the partitions 15, are formed in an inclined manner so that the lower ends thereof broaden. However, the end faces of the bottom part 12*a*, which is formed at the same time as the source electrodes of the TFTs 12, are formed so as to be substantially vertical. As such, the damming effect of the second damming wall Wb can be increased. Accordingly, on the substrate on which the first damming wall Wa and the second damming wall Wb are formed, a situation where the organic resin material, which is ejected using an ink-jet method to serve as the organic layer 20*a*, spreads out to the periphery can be suppressed. This makes it possible to form the circumferential end parts of the organic layer 20*a* in the sealing film 22*c* with precision. As a result, a gap between the first damming wall Wa and the second damming wall Wb, i.e., the width of the frame region F, can be designed to be narrow. The circumferential end parts of the organic layer 20*a*, which partially constitute the sealing film 22*c*, can therefore be formed with precision, and a narrower frame can be realized.

To describe (2) in more detail, the second inorganic layer 21*c* is provided so as to cover the organic layer 20*a*, and thus the sealing performance of the sealing film 22*c* can be improved when the second inorganic layer 21*c* is composed of a silicon nitride film, which has high barrier properties.

(4) In the frame region F, the third damming wall Wc, which includes the bottom part 12*b*, the middle part 13*c*, and the top part 15*c*, is provided in the periphery of the second damming wall Wb. The bottom part 12*b* is formed from the material constituting the source electrodes of the TFTs 12. The middle part 13*c* is formed from the material constituting the flattening film 13. The top part 15*c* is formed from the material constituting the partitions 15. Accordingly, even if the organic resin material that will serve as the organic layer 20*a* of the sealing film 22*c* surpasses the second damming wall Wb, a situation where the organic resin material spreads to the periphery can be suppressed.

Although the present embodiment describes a configuration in which the third damming wall Wc is added to the organic EL display device 30*a* of the above-described the first embodiment as an example, a configuration in which the third damming wall Wc is added to the organic EL display device 30*b* of the above-described the second embodiment is also possible.

Fourth Embodiment

Figure 11:
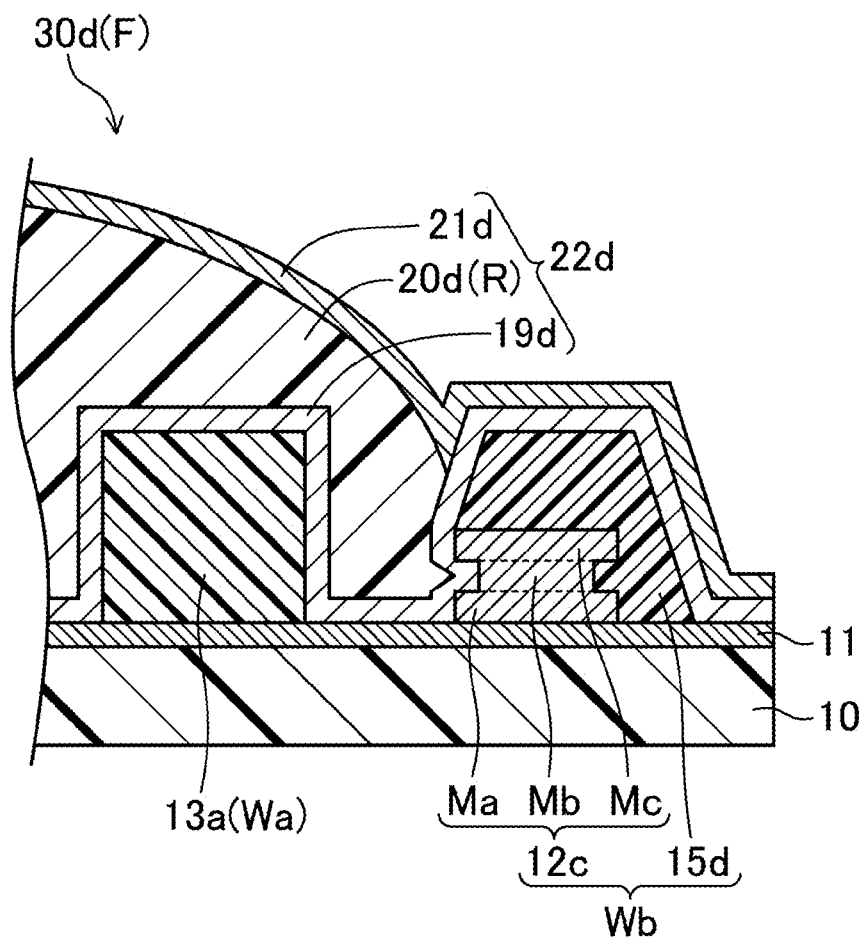
FIG. 11 is a cross-sectional view illustrating, in detail, the configuration of a frame region of an organic EL display device according to a fourth embodiment of the disclosure.

FIG. 11 illustrates the fourth embodiment of an organic EL display device according to the disclosure. Here, FIG. 11 is a cross-sectional view illustrating, in detail, the configuration of the frame region F in an organic EL display device 30*d* according to the present embodiment.

The foregoing Embodiments 1 to 3 describe the organic EL display devices 30*a* to 30*c*, in which the end faces of the bottom part 12*a* of the second damming wall Wb are vertical, as examples. However, the present embodiment describes the organic EL display device 30*d*, in which end portions of a bottom part 12*c* of the second damming wall Wb are formed with an overhanging shape, as an example.

As illustrated in FIG. 11, the organic EL display device 30d includes the base substrate 10, the organic EL element 18 (see FIG. 2 and the like), the first damming wall Wa and the second damming wall Wb, and a sealing film 22d. The organic EL element 18 is provided upon the base substrate 10 with the base coating film 11 interposed therebetween, and the sealing film 22d is provided covering the organic EL element 18, the first damming wall Wa, and the second damming wall Wb. Like the organic EL display device 30a of the above-described the first embodiment, in the organic EL display device 30d, the frame-shaped frame region F is defined in the periphery of the rectangular display region D in which images are displayed. The first damming wall Wa and the second damming wall Wb are provided in the frame region F.

As illustrated in FIG. 11, the first damming wall Wa is in contact with the circumferential end part R of an organic layer 20d of the sealing film 22d, with a first inorganic layer 19d (described later) of the sealing film 22d located between the first damming wall Wa and the organic layer 20d. The first damming wall Wa overlaps with the circumferential end part R of the organic layer 20d.

As illustrated in FIG. 11, the second damming wall Wb is in contact with the circumferential end part R of the organic layer 20d of the sealing film 22d, with the first inorganic layer 19d of the sealing film 22d located between the second damming wall Wb and the organic layer 20d. The second damming wall Wb overlaps with the edge of the circumferential end part R of the organic layer 20d. Here, as illustrated in FIG. 11, the second damming wall Wb includes the bottom part 12c and a top part 15d. The bottom part 12c is formed from the same material and in the same layer as the source electrodes of the TFTs 12. The top part 15d is provided on the bottom part 12c and is formed from the same material and in the same layer as the partitions 15.

As illustrated in FIG. 11, the bottom part 12c includes a third conductive layer Ma, a first conductive layer Mb, and a second conductive layer Mc. The third conductive layer Ma is provided on the base coating film 11 with an interlayer insulating film (not shown) interposed therebetween. The first conductive layer Mb is provided on the third conductive layer Ma, and the second conductive layer Mc is provided on the first conductive layer Mb. A perimeter edge surface of the first conductive layer Mb is located inward from perimeter edge surfaces of the third conductive layer Ma and the second conductive layer Mc. Although the present embodiment describes a configuration in which the entirety of the perimeter edge surface of the first conductive layer Mb is located inward from the perimeter edge surfaces of the third conductive layer Ma and the second conductive layer Mc, it is also possible for at least a part of the perimeter edge surface of the first conductive layer Mb to be located inward from the perimeter edge surface of the third conductive layer Ma and the second conductive layer Mc. Additionally, although the present embodiment describes an example of the bottom part 12c having a three-layer structure in which the third conductive layer Ma, the first conductive layer Mb, and the second conductive layer Mc are layered in that order, the bottom part 12c may have a two-layer structure in which the first conductive layer Mb and the second conductive layer Mc are layered in that order and the perimeter edge surface of the first conductive layer Mb is located inward from the perimeter edge surface of the second conductive layer Mc.

The third conductive layer Ma is composed of a metal conductive film such as titanium, for example (with a thickness of approximately 100 nm). The first conductive layer Mb is composed of a metal conductive film such as aluminum, for example (with a thickness of approximately 500 nm). The second conductive layer Mc is composed of a metal conductive film such as titanium, for example (with a thickness of approximately 100 nm). Here, the bottom part 12c composed of the third conductive layer Ma, the first conductive layer Mb, and the second conductive layer Mc is formed having an overhanging shape. First, the end faces thereof are formed to be substantially vertical through dry etching carried out when forming the TFTs 12, and then, a part corresponding to the first conductive layer Mb is removed through wet etching carried out when forming the first electrodes 14 to achieve the overhanging shape.

As illustrated in FIG. 11, the sealing film 22d includes the first inorganic layer 19d, the organic layer 20d, and a second inorganic layer 21d. The first inorganic layer 19d is provided so as to cover the organic EL element 18. The organic layer 20a is provided on the first inorganic layer 19d. The second inorganic layer 21d is provided so as to cover the organic layer 20d.

The first inorganic layer 19d and the second inorganic layer 21d are composed of an inorganic insulating film such as a silicon nitride film, a silicon oxide film, a silicon oxynitride film, or the like, for example. Preferably, the second inorganic layer 21d is composed of a silicon nitride film, which has high barrier properties, for example.

The organic layer 20d is composed of an organic resin material such as an acrylate, polyurea, parylene, polyimide, polyamide, or the like, for example.

The above-described organic EL display device 30d is flexible. In each of the subpixels, the light-emitting layer 3 of the organic EL layer 16 is caused, via the TFT 12, to emit light as appropriate so as to display images.

The organic EL display device 30d of the present embodiment can be manufactured by, for example, changing the material constituting the source electrodes of the TFTs 12 in the method of manufacturing the organic EL display device 30a described above in the first embodiment.

The organic EL display device 30d of the present embodiment described above can achieve the following effect (5), in addition to the above-described effects (1) and (2).

To describe (1) in more detail, the second damming wall Wb that overlaps with the edge of the circumferential end part R of the organic layer 20d in the sealing film 22d includes the bottom part 12c and the top part 15d. The bottom part 12c is formed from the material that constitutes the source electrodes of the TFTs 12. The top part 15d is formed from the material that constitutes the partitions 15. Here, in the second damming wall Wb, the end faces of the top part 15d, which is formed at the same time as the partitions 15, are formed in an inclined manner so that the lower ends thereof broaden. However, the end faces of the bottom part 12c, which is formed at the same time as the source electrodes of the TFTs 12, are formed so as to be substantially vertical. As such, the damming effect of the second damming wall Wb can be increased. Accordingly, on the substrate on which the first damming wall Wa and the second damming wall Wb are formed, a situation where the organic resin material, which is ejected using an ink-jet method to serve as the organic layer 20d, spreads out to the periphery can be suppressed. This makes it possible to form the circumferential end parts of the organic layer 20d in the sealing film 22d with precision. As a result, a gap between the first damming wall Wa and the second damming wall Wb, i.e., the width of the frame region F, can be designed to be narrow. The circumferential end parts of the organic layer 20d, which partially constitutes the sealing film 22d, can therefore be formed with precision, and a narrower frame can be realized.

To describe (2) in more detail, the second inorganic layer 21d is provided so as to cover the organic layer 20d, and thus the sealing performance of the sealing film 22d can be improved when the second inorganic layer 21d is composed of a silicon nitride film, which has high barrier properties.

(5) In the bottom part 12c of the second damming wall Wb, at least a part of the perimeter edge surface of the first conductive layer Mb is located further inward than the perimeter edge surfaces of the third conductive layer Ma and the second conductive layer Mc, and the end portion is therefore formed having an overhanging shape. The damming effect of the second damming wall Wb can therefore be further increased.

Although the present embodiment describes a configuration in which the end portions of the bottom part 12a of the second damming wall Wb in the organic EL display device 30a of the above-described the first embodiment are formed having an overhanging shape as an example, a configuration in which the end portions of the bottom part 12a of the second damming wall Wb in the organic EL display device 30b of the above-described the second embodiment, as well as the bottom part 12a of the second damming wall Wb and the bottom part 12b of the third damming wall Wc in the organic EL display device 30c of the above-described the third embodiment, are formed having an overhanging shape, is also possible.

Other Embodiments

Although the foregoing embodiments describe the organic EL display devices 30a to 30d as examples, the disclosure can also be applied in an organic EL display device in which combinations of the constituent elements of the organic EL display devices 30a to 30d described as examples have been changed as desired.

The foregoing embodiments describe an example of the organic EL layer having a five-layer structure including the hole injection layer, the hole transport layer, the light-emitting layer, the electron transport layer, and the electron injection layer. However, for example, the organic EL layer may have a three-layer structure including a hole injection-cum-transport layer, a light-emitting layer, and an electron transport-cum-injection layer.

In the embodiments described above, the example of the organic EL display devices including the first electrode as an anode and the second electrode as a cathode. However, the disclosure is also applicable to an organic EL display device, in which the layers of the structure of the organic EL layer are in reverse order, with the first electrode being a cathode and the second electrode being an anode.

In the embodiments described above, the example of the organic EL display devices including the element substrate in which the electrode of the TFT connected to the first electrode is the drain electrode. However, the disclosure is also applicable to an organic EL display device including an element substrate in which the electrode of the TFT connected to the first electrode is referred to as the source electrode.

Although the foregoing embodiments describe organic EL display devices as examples of display devices, the disclosure can be applied in display devices including a plurality of light emitting elements that are driven by an electrical current. For example, the disclosure is applicable to display devices including quantum dot light emitting diodes (QLEDs), which are light emitting elements using a quantum dot-containing layer.

INDUSTRIAL APPLICABILITY

As described above, the disclosure is applicable in flexible display devices.

REFERENCE SIGNS LIST

D Display region
F Frame region
Ma Third conductive layer
Mb Second conductive layer
Mc First conductive layer
R Circumferential end part
Wa First damming wall
Wb Second damming wall
Wc Third damming wall
10 Base substrate
12 TFT (switching element)
12a, 12c Bottom part
12ba First metal layer
12bb Second metal layer
13 Flattening film
13b, 13c Middle part
14 First electrode (pixel electrode)
15 Partition
15a to 15d Top part
18 Organic EL element (light emitting element)
19a to 19d First inorganic layer
20a, 20d Organic layer
21a to 21d Second inorganic layer
22a to 22d Sealing film
30a to 30d Organic EL display device

The invention claimed is:

1. A display device comprising:
a base substrate;
a plurality of switching elements provided on the base substrate;
a flattening film, provided on the plurality of switching elements, that flattens a surface shape formed by the plurality of switching elements;
a light emitting element provided on the flattening film, the light emitting element including a partition; and
a sealing film covering the light emitting element, the sealing film including a first inorganic layer, an organic layer, and a second inorganic layer layered in that order, wherein
a display region in which an image is displayed, and a frame region located in the periphery of the display region, are defined in the display device,
a first damming wall and a second damming wall are provided in the frame region, the first damming wall being made from a first organic material, surrounding the display region, and overlapping with a circumferential end portion of the organic layer, the second damming wall being defined in the periphery of the first damming wall from a second organic material, the second damming wall including a second top portion and overlapping with an edge of the circumferential end portion of the organic layer,
the second damming wall includes a second bottom portion located closer to the base substrate than the second top portion is, the second bottom portion being made from a material constituting a portion of the switching elements, the flattening film is made from the first organic material, and a side surface of the second bottom portion closest to the display region is in contact with the sealing film.

2. The display device according to claim 1, wherein the second damming wall includes a second middle portion between the second top portion and the second bottom portion, the second middle portion being made from the first organic material.

3. The display device according to claim 1, wherein in the frame region, a third damming wall is provided in the periphery of the second damming wall, the third damming wall including a third bottom portion, a third middle portion, and a third top portion, the third bottom portion being made from a material defining a portion of the switching elements, the third middle portion being made from the first organic material, and the third top portion being made from the second organic material.

4. The display device according to claim 1, wherein the partition is made from the second organic material.

5. The display device according to claim 1, wherein a portion of each switching element is a source electrode.

6. The display device according to claim 1, wherein a portion of each switching element is a gate electrode.

7. The display device according to claim 1, wherein an angle defined by a surface of the base substrate and a side surface of the second top portion is greater than or equal to 70 degrees.

8. The display device according to claim 1, wherein the second top portion is in contact with the second bottom portion on a side of the second bottom portion opposite the display region.

9. The display device according to claim 1, wherein the second bottom portion includes a first conductive layer and a second conductive layer layered in that order, and at least a portion of a perimeter edge surface of the first conductive layer is located further inward than a perimeter edge surface of the second conductive layer.

10. The display device according to claim 9, wherein the second bottom portion includes a third conductive layer provided closer to the base substrate than the first conductive layer, and at least a portion of a perimeter edge surface of the first conductive layer is located further inward than a perimeter edge surface of the third conductive layer.

11. The display device according to claim 9, wherein the first conductive layer includes an aluminum film.

12. The display device according to claim 1, wherein the second inorganic layer is provided covering the organic layer.

13. The display device according to claim 1, wherein a first metal layer is provided between the base substrate and the first damming wall, the first metal layer protruding from the first damming wall.

14. The display device according to claim 13, wherein a second metal layer is provided between the base substrate and the second damming wall, the second metal layer protruding from the top portion.

15. The display device according to claim 1, wherein the light emitting element is an organic electroluminescence (EL) element.

16. The display device according to claim 1, wherein the base substrate is flexible.

17. The display device according to claim 1, wherein the side surface of the second bottom portion is substantially vertical.

* * * * *